United States Patent [19]

Gerson

[11] Patent Number: 4,544,919

[45] Date of Patent: Oct. 1, 1985

[54] METHOD AND MEANS OF DETERMINING COEFFICIENTS FOR LINEAR PREDICTIVE CODING

[75] Inventor: Ira A. Gerson, Hoffman Estates, Ill.

[73] Assignee: Motorola, Inc., Schaumburg, Ill.

[21] Appl. No.: 687,486

[22] Filed: Dec. 28, 1984

Related U.S. Application Data

[63] Continuation-in-part of Ser. No. 454,929, Jan. 3, 1982, abandoned.

[51] Int. Cl.[4] .............. H03K 13/00

[52] U.S. Cl. .............. 340/347; 381/41; 364/724

[58] Field of Search .............. 340/347 AD, 347 DD; 381/36-52; 364/724, 725, 728

[56] References Cited

U.S. PATENT DOCUMENTS

| | | | |
|---|---|---|---|
| 3,662,115 | 5/1972 | Saito | 381/40 |
| 4,038,495 | 7/1977 | White | 179/1 SA |
| 4,058,676 | 11/1977 | Wilkes et al. | 179/1 |
| 4,070,709 | 1/1978 | Roberts et al. | 364/602 |
| 4,125,900 | 11/1978 | Betts | 364/724 |
| 4,133,976 | 1/1979 | Atal et al. | 179/1 P |
| 4,161,625 | 7/1979 | Katterfeldt et al. | 179/1 SC |
| 4,184,049 | 1/1980 | Crochiere et al. | 179/1 SA |
| 4,191,853 | 3/1980 | Piesinger | 179/1 SA |
| 4,220,819 | 9/1980 | Atal | 179/1 SA |
| 4,230,906 | 10/1980 | Davis | 179/1 SA |
| 4,282,405 | 11/1979 | Taguchi | 381/36 |
| 4,340,781 | 7/1982 | Ichikawa | 364/724 |
| 4,378,469 | 3/1983 | Fette | 364/728 |
| 4,389,540 | 6/1983 | Nakamura | 381/41 |

FOREIGN PATENT DOCUMENTS

| | | | |
|---|---|---|---|
| 2026289 | 1/1980 | United Kingdom | 381/41 |

OTHER PUBLICATIONS

Le Roux "IEEE Transactions on Acoustics, Speech and Signal Processing", Jun. 1977, pp. 257-259.

*Primary Examiner*—Charles D. Miller
*Attorney, Agent, or Firm*—James E. Jacobson, Jr.; Donald B. Southard; Edward M. Roney

[57] ABSTRACT

An improved method and means of determining reflection coefficients that characterize an electrical signal that obtains characteristics of an all-zero inverse lattice filter. The reflection coefficients are obtained by filtering the signal, sample the filtered signal, obtaining the elements of a correlation array from the samples, initializing values of arrays forward residuals, backward residuals, and cross correlation of residuals, combining array elements to obtain a first reflection coefficient, removing from the forward, backward and cross-correlation arrays the effect of the first reflection coefficient, calculating from the revised arrays a second coefficient, and repeating the calculations to the desired order. In a second embodiment of the present invention, samples are selected from the digitized signal and multiplied by a windowing function. The windowed samples are used to derive values of an autocorrelation array which eliminates the need for both forward and backward arrays as in the first embodiment of the invention.

20 Claims, 11 Drawing Figures

METHOD AND MEANS OF DETERMINING COEFFICIENTS FOR LINEAR PREDICTIVE CODING

CROSS REFERENCE TO RELATED APPLICATIONS

This application is a continuing application and specifically a continuation-in-part patent application based on a U.S. patent application of the same title, Ser. No. 06/454/929, filed Jan. 3, 1982.

BACKGROUND OF THE INVENTION

This invention relates to linear predictive coding. In particular, it is an improved method and means of determining coefficients for linear predictive coding. Linear predictive coding is a method of analyzing a speech signal and characterizing that signal in terms of coefficients which can be encoded, broadcast, received, and decoded to recover a close approximation to the original signal. The existence of redundancies in speech makes it possible to use encoded descriptions of the speech that can be carried in a communication channel having a bandwidth that is less than the bandwidth of the speech. This is in distinct contrast to many well-known forms of converting speech into digital signals. Most of these methods require a bandwidth that is greater than the bandwidth of the speech.

Linear predictive coding (LPC) of speech begins conceptually with a model of the human speech-producing system. The model has a source of sound that is analogous to the vocal cords. That source is coupled acoustically to a stacked array of hollow cylindrical tubes that is analogous to the cavities of the throat and mouth in a human speaker. From the model, speech is characterized by four types of quantities. The first of these is a measure of whether speech is voiced or unvoiced. A voiced signal begins with an input from the vocal cords, while an unvoiced signal is produced by the action of the rest of the vocal tract on moving air alone. This produces the differences in sound between "s" which is unvoiced and its voiced equivalent "z", for example. A second characteristic of the sound is the pitch, the fundamental frequency produced by the vocal cords in making a voiced sound. A third characteristic is the energy. Finally, the effect of the throat and mouth on either voiced or unvoiced sound is summarized by obtaining some measure of the transfer function of the vocal tract. Such a measure might be the reflection coefficients of the structure, the poles of the transfer function of the structure, the logarithmic area ratios (LAR's) of the structure, or any of several other well-known functions of such resonances. In addition, various mathematical transforms of these functions may have utility for particular purposes. The functions are interrelated so that any one set can be determined from a knowledge of any other set.

The present invention is an improved method and means of determining quantities corresponding to reflection coefficients. The reflection coefficients are coefficients with a specific all pole filter structure known as a lattice filter. The reflection coefficients discussed here are the electrical analog of acoustical reflection coefficients.

One way of obtaining the reflection coefficients that characterize a sample of a signal such as speech is to determine the characteristics of a lattice filter that will reproduce the signal when excited by an impulse. Examples of several approaches of performing such an analysis are given in an article entitled "Stable and Efficient Lattice Methods for Linear Prediction" by Makhoul in "IEEE Transactions on Acoustics, Speech, and Signal Processing, Vol. ASSP-25, No. 5, October, 1977. This article points out that an analysis based on the all-pole lattice filter is stable without windowing but at a computational cost that is several times the cost of the auto-correlation and covariance methods of calculation. What Makhoul refers to as the computational costs of computer analysis are proportional to the equipment costs of realizing a circuit for comparable analysis on a semiconductor chip. When windowing of the input signal is performed prior to computation of the relection coefficients, the resulting all pole filter is guaranteed to be stable provided enough numerical precision is provided throughout the computation. Makhoul points out that with finite precision arithmetic unstable filters are indeed possible using well known autocorrelation techniques.

SUMMARY OF THE INVENTION

It is an object of the present invention to provide an improved method and means of determining reflection coefficients of a signal.

It is a further object of the present invention to provide an improved method and means of determining parameters of an all-pole lattice filter that characterize an electrical signal.

Other objects will become apparent in the course of a detailed description of the invention.

In one embodiment of the present invention, an improved method and means of determining reflection coefficients that characterize an electrical signal obtains characteristics of an all-zero inverse lattice filter. The reflection coefficients are obtained by filtering the signal, sampling the filtered signal, obtaining the elements of a correlation array from the samples, initializing values of arrays of forward residual autocorrelations, backward residual autocorrelations, and cross correlation of residuals, combining array elements to obtain a first reflection coefficient, removing from the forward, backward and cross-correlation arrays the effect of the first reflection coefficient, calculating from the revised arrays a second reflection coefficient, and repeating the calculations to the desired order.

In a second embodiment of the present invention, an improved method and means of determining reflection coefficients that characterize an electrical signal obtains characteristics of an all-zero inverse lattice filter. The reflection coefficients are obtained by filtering the signal, sampling the filtered signal, windowing the sampled signal, obtaining the elements of an autocorrelation array from the windowed samples, initializing values of arrays of residual autocorrelations, and cross correlation of residuals, combining array elements to obtain a first reflection coefficient, removing from the autocorrelation and cross-correlation arrays the effect of the first reflection coefficient, calculating from the revised arrays a second reflection coefficient, and repeating the calculations to the desired order.

The present invention provides means for computing reflection coefficients for both non-windowed or windowed signals which are easily implemented in fixed pointed arithmetic and are either more computationally efficient or more numerically robust (to quantization effects) than previous known fixed point techniques. In addition the present invention allows for quantization of the reflection coefficients to be compensated for by subsequently calculated reflection coefficients.

BRIEF DESCRIPTION OF THE DRAWINGS

FIG. 7 is an overall block diagram of a circuit for the practice of a second embodiment of the present invention.

FIG. 8 is an expanded circuit diagram of the address calculator of the embodiment of FIG. 7.

FIG. 9 is an expanded circuit diagram of the update calculator of FIG. 7.

FIG. 10 is an expanded circuit diagram of the reflection-coefficient calculator of FIG. 7.

FIG. 11 is a flowchart of a method for practicing the second embodiment of the present invention.

DETAILED DESCRIPTION OF THE INVENTION

Figure 1:
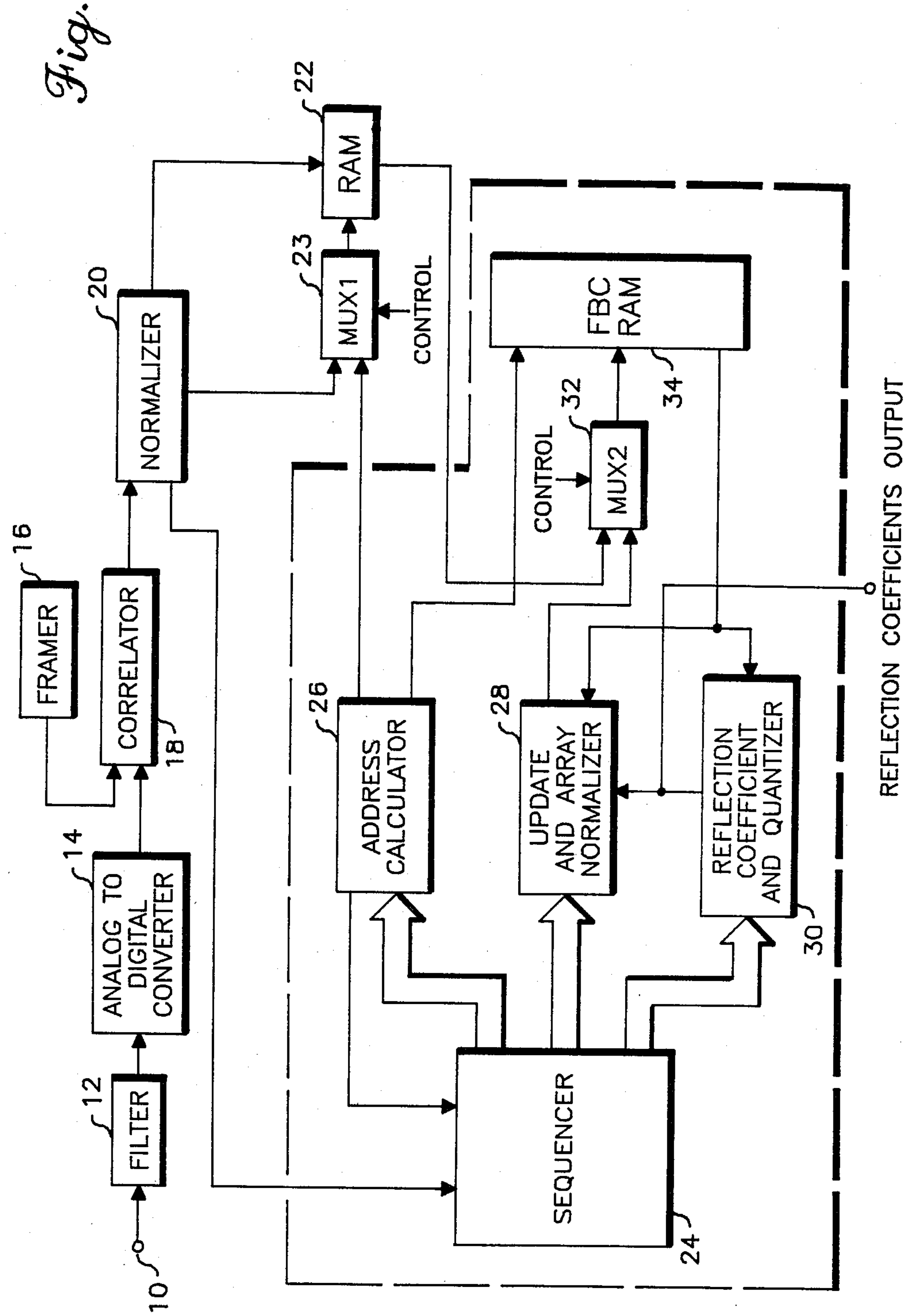
FIG. 1 is an overall block diagram of a circuit for the practice of the present invention.

FIG. 1 is an overall block diagram of a circuit for the practice of the invention. In FIG. 1 an electrical analog signal that is to be analyzed is applied at terminal 10. That signal will typically be an electrical analog of a voice signals, although it may be any electrical signal that exhibits redundancies analogous to those of speech. Examples of such other signals include video scans and seismic analysis records. Whatever the source, the signal at terminal 10 is applied to a filter 12, if necessary, to limit its bandwidth. If the bandwidth is already adequate, filter 12 may comprise a direct wire connection, or filter 12 may combine a bandpass filter with any of a number of systems of pre-emphasis that are commonly used in radio broadcasting. The output of filter 12, treated as described, is applied to analog-to-digital converter (ADC) 14. The digital output of ADC 14 will be separated into frames of a convenient length, of the order of tens of milliseconds. That function is here indicated as being performed by framer 16 as a means of insuring that the digital input to correlator 18 establishes correlation among samples in the same frame. The function of framer 16 could also be combined into correlator 18 or ADC 14. It should be noted that the ADC 14 is not necessary if the signal is already in digital form. The correlation parameters are obtained in the circuit of FIG. 1 because that circuit will be used to determine reflection coefficients.

The output of correlator 18 is applied, if necessary, to a normalizer 20 to normalize output values to a common level. The output of normalizer 20 is taken to random-access memory (RAM) 22 where it is stored in an address that is directed by a signal from multiplexer 23. Normalizer 20 also generates a signal indicating the completion of the operation of correlator 18 for one frame. That signal is taken as an input to sequencer 24. Signals from sequencer 24 are coupled out to control an address calculator 26, an update calculator 28, a reflection coefficient calculator 30, multiplexer 23, and multiplexer 32. Normalizer 20 determines the appropriate addresses in RAM 22 for storing the coefficients of a correlation array that the serial readout will be in a desired order. The output of normalizer 20 is applied to multiplexer 23 to apply first an initial condition to RAM 22 that is determined from normalizer 20, and then accessed by address instructions from address calculator 26.

The output of RAM 22 is applied through multiplexer 32 to apply first an initial condition of RAM 34 that is determined from normalizer 20, and then accessed by address instructions from address calculator 26. The output of RAM 22 is applied through multiplexer 32 to RAM 34. Multiplexer 32 selects as an input to RAM 34 either the output of RAM 22 or the output of update calculator 28. Multiplexer 32 is controlled by a signal from sequencer 24. The location of storage elements in RAM 34 is controlled by a signal from address calculator 26. The output of RAM 34 is read into update calculator 28 and reflection coefficient calculator 30. Update calculator 28 also receives as an input the calculated reflection coefficients from reflection coefficient calculator 30, which coefficients are taken as the output of the circuit of FIG. 1.

Figure 2:
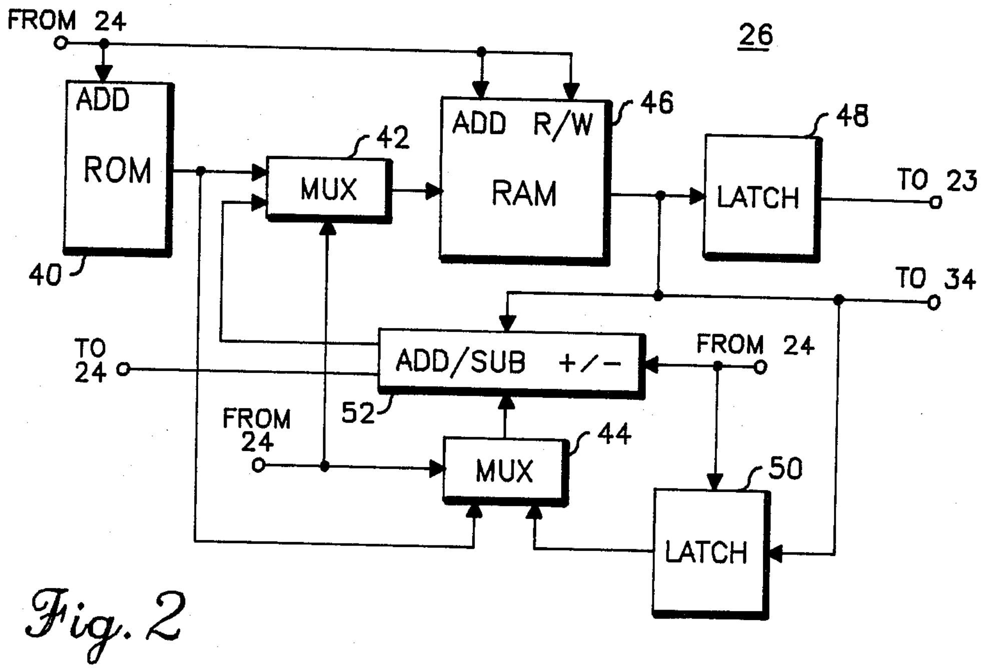
FIG. 2 is an expanded circuit diagram of the address calculator of FIG. 1.

FIG. 2 is a circuit diagram of the address calculator 26 of FIG. 1. Address calculator 26 produces the addresses that direct the retrieval of matrix elements in RAM 22 and the storage and retrieval of array elements in RAM 34. In FIG. 2 sequencer 24 supplies addresses to read-only memory (ROM) 40. ROM 40 is read out into multiplexers 42 and 44. The output of multiplexer 42 is taken to RAM 46 which is loaded under the control of signals from sequencer 24. The output of RAM 46 is taken directly as the input to RAM 34 of FIG. 1., and it is also applied to latches 48 and 50, as well as the add/subtract unit 42. The output of latch 48 is taken to multiplexer 23 of FIG. 1, and than to RAM 22. The output of latch 50 is multiplexed in multiplexer 44 with the output of ROM 40 under the control of a signal from sequencer 24. The output of multiplexer 44 is applied to add-subtract unit 52 where it is supplied as an input to be either added or subtracted from the output of RAM 46, depending upon a control signal from sequencer 24. The add/subtract unit 52 also has an output connected to sequencer 24 which indicates a zero result from the add/subtract operation.

Figure 3:
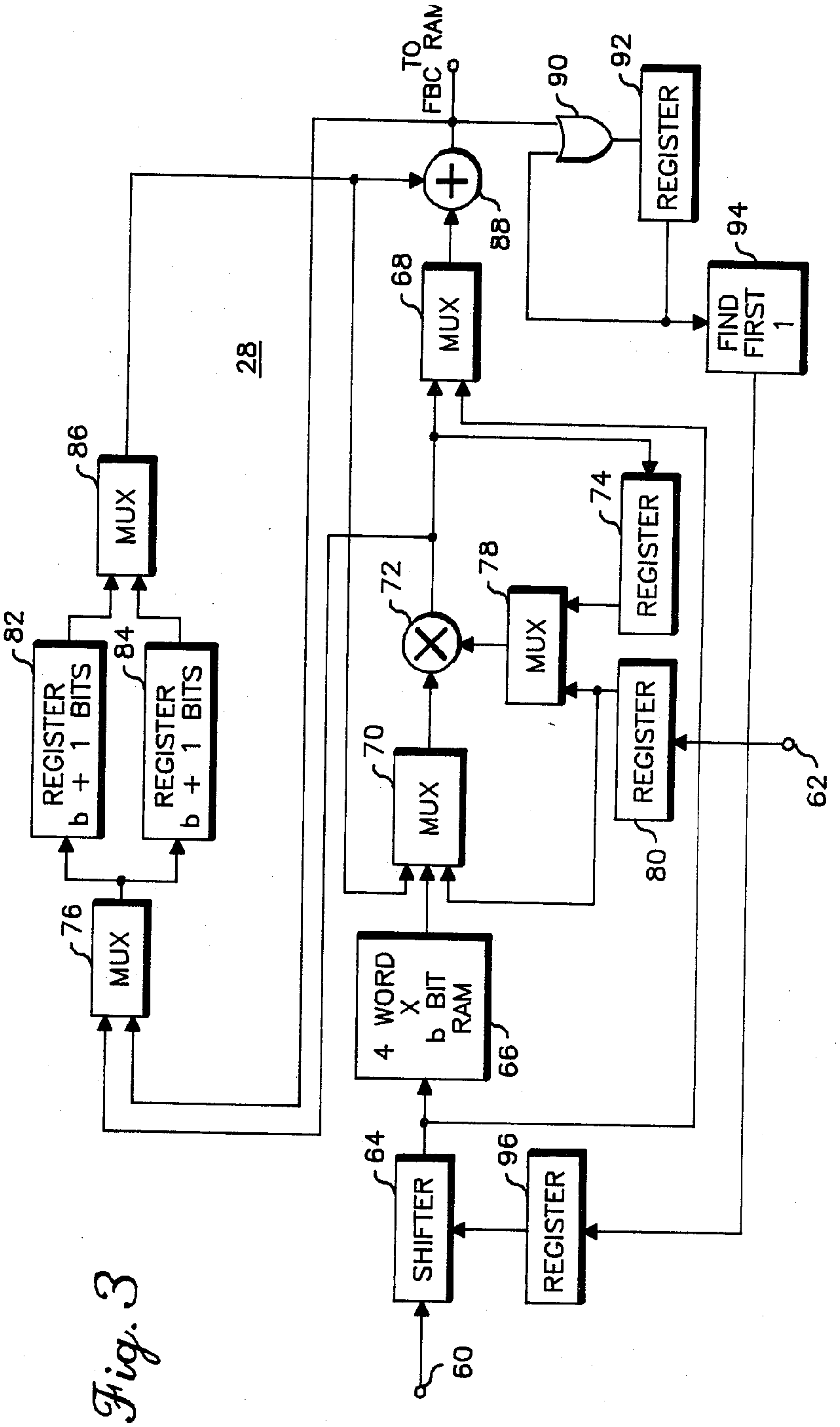
FIG. 3 is an expanded circuit diagram of the update calculator of FIG. 1.

FIG. 3 is a circuit diagram of the update calculator 28 of FIG. 1. In FIG. 3 data inputs are applied at terminals 60 and 62. The input at terminal 60 is the output of RAM 34 of FIG. 1. Terminal 60 is connected to a shifter 64, the output of which is taken to a RAM 66 and to a multiplexer 68. The output of RAM 66 is taken to multiplexer 70 which, in turn, is connected to multiplier 72. The output of multiplier 72 is taken as an input to multiplexer 68, as an input to register 74, and as an input to multiplexer 76. The output of register 74 is coupled through multiplexer 78 to supply a second input to multiplier 72.

Terminal 62 is connected to reflection-coefficient calculator 30 of FIG. 1 to receive calculated reflection coefficients which are then coupled to register 80 of FIG. 3. The outputs of registers 74 and 80 are applied to multiplexer 78 to be selected under the control of a signal from sequencer 24 of FIG. 1. The output of register 80 of FIG. 3 is also taken as an input to multiplexer 70. Multiplexer 76 produces an output that is taken to registers 82 and 84, the outputs of which supply inputs to multiplexer 86. The output of multiplexer 86 is taken as an input to multiplexer 70 and as an input to summer 88. The output of summer 88 is taken as input to multiplexer 76 as a data input to RAM 34 of FIG. 1 and as an input to OR gate 90 of FIG. 3. The output of OR gate 90 is taken to register 92 which supplies an output that is taken both as a second input to OR gate 90 and as an input to priority encoder 94. The output of priority encoder 94 controls register 96 that operates shifter 64. The combination of shifter 64, register 96, OR gate 90, register 92 and priority encoder 94 comprises a normalizer that normalizes the output of RAM 34 of FIG. 1. If it is not desired or is considered unnecessary to normalize coefficients, then terminal 60 can supply an input directly to RAM 66 and the elements just described could be removed from the circuit of FIG. 3.

Figure 4:
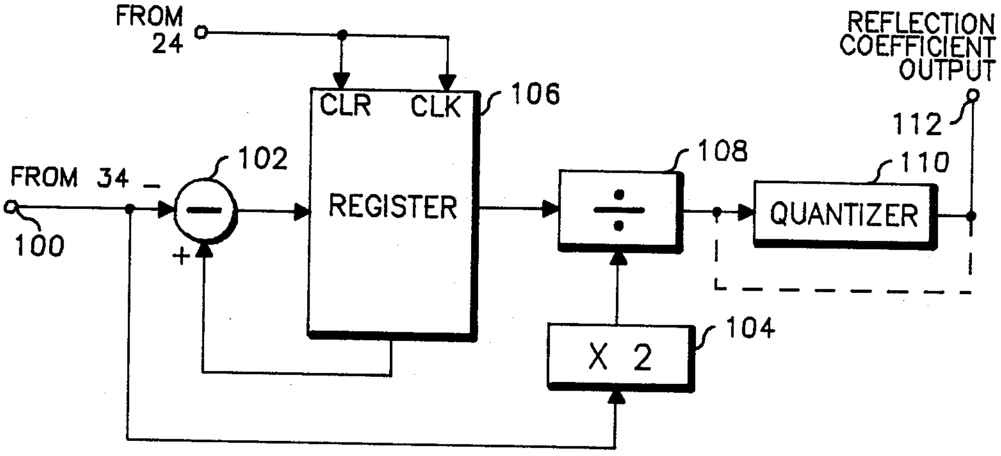
FIG. 4 is an expanded circuit diagram of the reflection-coefficient calculator of FIG. 1.

FIG. 4 is a circuit diagram of the reflection coefficient calculator 30 of FIG. 1. In FIG. 4 terminal 100 receives a signal from RAM 34 that is applied to a subtractor 102 and a multiply-by-two circuit 104. The output of subtractor 102 is connected to register 106, which produces one output that is connected as an input to subtractor 102, and another output that is taken to divider 108. The output of divider 108 may be taken directly as a reflection coefficient. In the alternative, it may be desirable to quantize that value as in quantizer 110. In either case, the signal at terminal 112 is a reflection coefficient of the equivalent filter of the original input signal. The reflection coefficients may be used directly as coefficients in LPC or the may be transformed into a different function, as described earlier. If it is desired to convert reflection coefficients into LAR's, this can be combined readily with the quantization that is performed by quantizer 110. The choice of the particular functions is one of design.

Consider now the elements of FIG. 1 in terms of their functions. Filter 12 has already been described as optional. If the circuit of FIG. 1 is to be applied to speech for use in a typical radio speech bandwidth, then the input signal may need to be subjected to bandpass filtering. It may also be desirable to combine some form of pre-emphasis with filter 12. Filter 12 may also be used to prevent aliasing when the filtered signal is applied to ADC 14. The sample rate produced by ADC 14 is a design parameter. According to the well-known sampling theorem, it will be necessary to sample the input at a rate that is at least twice the frequency of the highest component contained in the input. Thus, sampling rates for speech are typically between 6.4 kHz and 10 kHz. Each sample is then encoded into a number of bits that typically ranges between 8 and 15, with 12 as a typical number. It follows that a typical frame will have on the order of one hundred samples. Correlator 18 takes these samples and determines from them the elements of a covariance. This matrix is symmetric. Element (i,k) of the covariance is obtained by summing, from $n=p$ to the total number of samples less 1, the product of the $(n-p)$th and the $(n-k)$th samples for zero less than or equal to k, less than or equal to i, less than or equal to p. In this statement, p is the prediction order, a number that is typically between 8 and 12 for speech. The index k is kept less than or equal to i to avoid recalculating equal terms on both sides of the axis of the symmetric array.

Normalizer 20 of FIG. 1 performs a function that is here indicated separately but that might also be included in correlator 18. Normalizer 20 shifts the elements of the correlation array so that the maximum value of any element in the array is between one-half and one in magnitude. Normalizer 20 then truncates the values of the elements thus shifted to a number of bits equal to the word length of the system. The covariance thus has a number of elements equal to $(p+1)^2$.

Since the covariance is symmetric, it can be described completely by storing the elements of the diagonal and the elements below the diagonal, a total of $(p+1)(p+2)/2$ elements. These elements are stored in RAM 22 in a location that is controlled by normalizer 20. A convenient method of loading RAM 22 is to load the diagonal elements, beginning with the element of highest order and proceeding to the diagonal element of lowest order, and then repeating in sequence down paths in the array that are parallel to the main diagonal. It should be noted that the F and B arrays are also symmetric and may be stored in a similar fashion.

Figure 5:
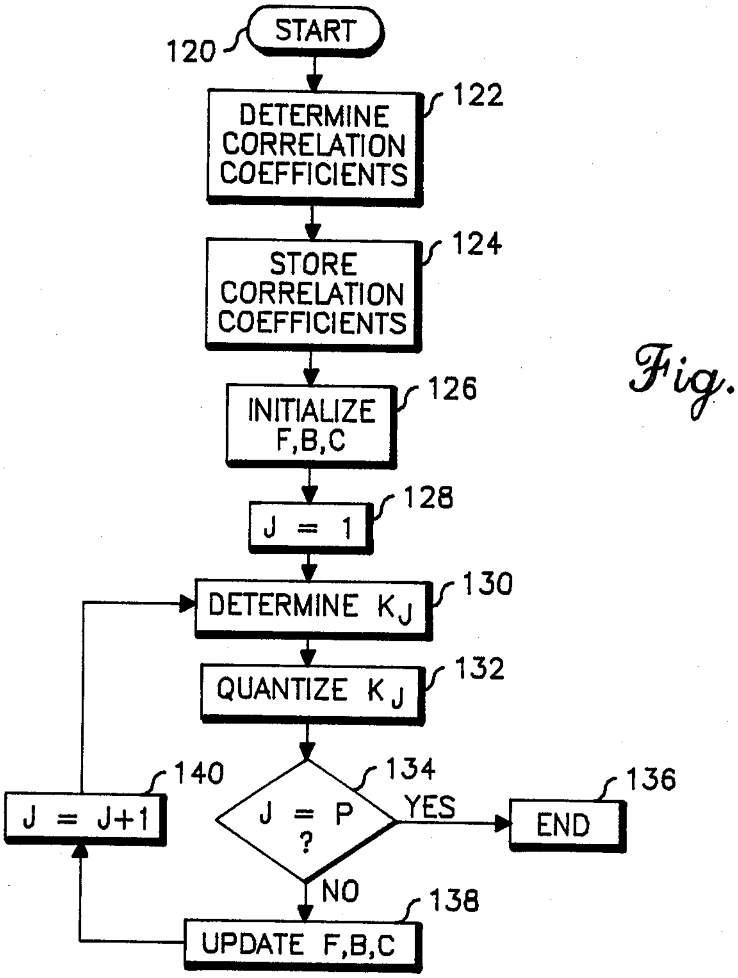
FIG. 5 is a flowchart of one way of practicing the method of the present invention.

The operation of the circuits of FIGS. 1, 2, 3 and 4 is explained further in the flowchart of FIG. 5 which shows the sequence of operations that are performed by those circuits. In FIG. 5, after a start 120, an operations block 122 directs the determination of correlation coefficients. Such a determination is well known. For discrete or sampled components, it is normally accomplished by a calculation such as that of the following equation:

$$\phi(i,k) = \sum_{n=p}^{N-1} s(n-i)s(n-k),\ 0 \leqq i \leqq k \leqq p$$

where s(n), $0 \leqq n \leqq N-1$ are samples of the audio signal during a frame and p is the order of the filter.

The next step in the flowchart of FIG. 5 is to initialize the matrices of F, B and C as indicated in operations block 126. The quantities F, B and C are intermediate quantities used in the determination of LPC coefficients. Their initial values are determined as follows:

$$F_0(i,k) = \phi(i,k)\ 0 \leqq i \leqq k \leqq p-1$$

$$B_0(i,k) = \phi(i+1,k+1)$$

$$C_0(i,k) = \phi(i,k+1)\ 0 \leqq i,k \leqq p-1$$

Operations box 128 next directs that the value of j equal 1. Operations box 130 then calls for the determination of the quantity kj, the jth reflection coefficient. This is determined as follows:

$$kK_j = \frac{-2C_{j-1}(0,0)}{F_{j-1}(0,0) + B_{j-1}(0,0)}$$

A variety of techniques are available for determining the reflection coefficient and the above technique is intended as an illustration of one embodiment of the present invention.

After the value of $k_j$ is determined, it is quantized according to the instruction from operations block 132 at a quantization level that is determined by the number of bits reserved to broadcast the particular LPC coefficient in question. Decision block 134 next tests to see whether $j=p$. If it does, all of the LPC coefficients have been calculated, and exit is to operations block 136 to end the calculation. If j does not equal p, the calculated value of $k_j$ is used in operations block 138 to update values of F, B and C according to the following relations:

$$F_j(i, k) = F_{j-1}(i, k) + k_j[C_{j-1}(i, k) + C_{j-1}(k, i)]k_j^2 B_{j-1}(i, k)\ 0 \leqq i \leqq k \leqq p = j = 1 \text{ for } F + 0$$

$$B_j(i, k) = B_{j-1}(i + 1, k + 1) + k_j[C_{j-1}(i + 1, k + 1) + C_{j-1}(k + 1, i + 1)] + k_j^2$$

$$F_{j-1}(i + 1, k + 1)$$

$$C_j(i, k) = C_{j-1}(i, k + 1) + k_j[B_{j-1}(i, k + 1) + F_{j-1}(i, k + 1)] + k_j^2 C_{j-1}(k + 1, i)$$

for $0 \leqq i, k \leqq (p - j - 1)$.

The value of j is increased by 1 in operations block 140, and control returns to operations block 130 to continue the calculations.

The preceding description shows a circuit for determining LPC coefficients and a flowchart of the steps performed by that circuit. The flowchart of FIG. 5 is also useful in directing the steps of a program for determining LPC coefficients by the same method using a computer. This has been done, and a computer program for determining LPC coefficients using this method is included as an appendix to this application. The technique of the present invention has the particular advantage that calculations may be performed efficiently in integer arithmetic. This speeds calculations and makes it possible to determine LPC coefficients in real time using the technique of the present invention.

FIG. 7 is an overall block diagram of a circuit for the practice of a second embodiment of the present invention. In FIG. 7 an electrical analog signal that is to be analyzed is applied at terminal 710. That signal will typically be an electrical analog of a voice signal, although it may be any electrical signal that exhibits redundancies analogous to those of speech. Examples of such other signals include video scans and seismic analysis records. Whatever the source, the signal at terminal 710 is applied to a filter 712, if necessary, to limit its bandwidth. If the bandwidth is already adequate, filter 712 may comprise a direct wire connection, or filter 712 may combine a bandpass filter with any of a number of systems of pre-emphasis that are commonly used in radio broadcasting. The output of filter 712, treated as described, is applied to analog-to-digital converter (ADC)714. The digital output of ADC 714 will be separated into frames of a convenient length, of the order of tens of milliseconds, and multiplied by a predetermined window function by windower 716. The function of windower 716 could also be combined into correlator 718 or ADC 714. It should be noted that the ADC 714 is not necessary if the signal is already in digital form. The correlation parameters are obtained in the circuit of FIG. 7 because that circuit will be used to determine reflection coefficients.

The output of correlator 718 is applied, if necessary, to a normalizer 720 to normalize output values to a common level. The output of normalizer 720 is taken to random-access memory (RAM) 722 where it is stored in an address that is directed by a signal from multiplexer 723. Normalizer 720 also generates a signal indicating the completion of the operation of correlator 718 for one frame. That signal is taken as an input to sequencer 724. Signals from sequencer 724 are coupled out to control an address calculator 726, an update calculator 728, a reflection coefficient calculator 730, multiplexer 723, and multiplexer 732. Normalizer 720 determines the appropriate addresses in RAM 722 for storing the coefficients of an autocorrelation array so that the serial readout will be in a desired order. The output of normalizer 720 is applied to multiplexer 723 to apply first an initial condition to RAM 722 that is determined from normalizer 720, and then accessed by address instructions from address calculator 726.

The output of RAM 722 is applied through multiplexer 732 to apply first an initial condition to RAM 734 that is determined from normalizer 720, and then accessed by address instructions from address calculator 726. The output of RAM 722 is applied through multiplexer 732 to RAM 734. Multiplexer 732 selects as an input to RAM 734 either the output of RAM 722 or the output of update calculator 728. Multiplexer 732 is controlled by a signal from sequencer 724. The location of storage elements in RAM 734 is controlled by a signal from address calculator 726. The output of RAM 734 is read into update calculator 728 and reflection coefficient calculator 730. Update calculator 728 also receives as an input the calculated reflection coefficients from reflection coefficient calculator 730, which coefficients are taken as the output of the circuit of FIG. 7.

FIG. 8 is a circuit diagram of the address calculator 726 of FIG. 7. Address calculator 726 produces the addresses that direct the retrieval of array elements in RAM 722 and the storage and retrieval of array elements in RAM 734. In FIG. 8 sequencer 724 supplies addresses to read-only memory (ROM) 840. ROM 840 is read out into multiplexers 842 and 844. The output of multiplexer 842 is taken to RAM 846 which is loaded under the control of signals from sequencer 724. The output of RAM 846 is taken directly as the input to RAM 734 of FIG. 7, and it is also applied to latches 848 and 850, as well as the add/subtract unit 842. The output of latch 848 is taken to multiplexer 723 of FIG. 7, and then to RAM 722. The output of latch 850 is multiplexed in multiplexer 844 with the output of ROM 840 under the control of a signal from sequencer 724. The output of multiplexer 844 is applied to add-subtract unit 852 where it is supplied as an input to be either added or subtracted from the output of RAM 846, depending upon a control signal from sequencer 724. The add/subtract unit 852 also has an output connected to sequencer 724 which indicates a zero result from the add/subtract operation.

FIG. 9 is a circuit diagram of the update calculator 728 of FIG. 7. In FIG. 9 data inputs are applied at terminals 960 and 962. The input at terminal 960 is the output of RAM 734 of FIG. 7. Terminal 960 is connected to a shifter 964, the output of which is taken to a RAM 966 and to a multiplexer 968. The output of RAM 966 is taken to multiplexer 970 which, in turn, is connected to multiplier 972. The output of multiplier 972 is taken as an input to multiplexer 968, as an input to register 974, and as an input to multiplexer 976. The output of register 974 is coupled through multiplexer 978 to supply a second input to multiplier 972.

Terminal 962 is connected to reflection-coefficient calculator 730 of FIG. 7 to receive calculated reflection coefficients which are then coupled to register 980 of FIG. 9. The outputs of registers 974 and 980 are applied to multiplexer 978 to be selected under the control of a signal from sequencer 724 of FIG. 7. The output of register 980 of FIG. 9 is also taken as an input to multiplexer 970. Multiplexer 976 produces an output that is taken to registers 982 and 984, the outputs of which supply inputs to multiplexer 986. The output of multiplexer 986 is taken as an input to multiplexer 970 and as an input to summer 988. The output of summer 988 is taken as input to multiplexer 976 as a data input to RAM 734 of FIG. 7 and as an input to OR gate 990 of FIG. 9. The output of OR gate 990 is taken to register 992 which supplies an output that is taken both as a second input to OR gate 990 and as an input to priority encoder 994. The output of priority encoder 994 controls register 996 that operates shifter 964. The combination of shifter 964, register 996, OR gate 990, register 992 and priority encoder 994 comprises a normalizer that normalizes the output of RAM 734 of FIG. 7. If it is not desired or is considered unnecessary to normalize coefficients, then terminal 960 can supply an input directly to RAM 966 and the elements just described could be removed from the circuit of FIG. 9.

FIG. 10 is a circuit diagram of the reflection coefficient calculator 730 of FIG. 7. In FIG. 10 terminal 1000 receives a signal from RAM 734 that is applied −1 multiplier 1002 and divider 1008. The output of −1 multiplier 1002 is connected to register 1006, which produces an output that is taken to divider 1008. The output of divider 1008 may be taken directly as a reflection coefficient. In the alternative, it may be desirable to quantize tha value as in quantizer 1010. In either case, the signal at terminal 1012 is a reflection coefficient of the equivalent filter of the original input signal. The reflection coefficients may be used directly as coefficients in LPC or they may be transformed into a different function, as described earlier. If it is desired to convert reflection coefficients into LAR's, this can be combined readily with the quantization that is performed by quantizer 1010. The choice of the particular functions is one of design.

Consider now the elements of FIG. 7 in terms of their functions. Filter 712 has already been described as optional. If the circuit of FIG. 7 is to be applied to speech for use in a typical radio speech bandwidth, then the input signal may need to be subjected to bandpass filtering. It may also be desirable to combine some form of pre-emphasis with filter 712. Filter 712 may also be used to prevent aliasing when the filtered signal is applied to ADC 714. The sample rate produced by ADC 714 is a design parameter. According to the well-known sampling theorem, it will be necessary to sample the input at a rate that is at least twice the frequency of the highest component contained in the input. Thus, sampling rates for speech are typically between 6.4 kHz and 10 kHz. Each sample is then encoded into a number of bits that typically ranges between 8 and 15, with 12 as a typical number. It follows that a typical frame will have of the order of one hundred samples. Windower 716 selects consecutive samples from ADC 714 to form a frame and then windows these samples as follows:

$$s(n)=x(n)w(n) \text{ for } 0 \geqq n \geqq N-1$$

Where N is the number of samples in a frame, x(n) are the samples from ADC 714, w(n) are the samples from a prestored window function (such as a Hamming or Hanning window which are well know in the art), and s(n) are the windowed samples out of the windower.

Correlator 718 takes the windowed samples and determines from them the elements of an autocorrelation array. Element i of the autocorrelation array is obtained by summing, from n=0 to the total number of samples less 1, the product of the (n)th and the (n−i)th samples for zero less than or equal to i, less than or equal to p. In this statement, p is the prediction order, a number that is typically between 8 and 12 for speech.

Normalizer 720 of FIG. 7 performs a function that is here indicated separately but that might also be included in correlator 718. Normalizer 720 shifts the elements of correlation array so that the maximum value of any element in the array is between one-half and one in magnitude. Normalizer 20 then truncates the values of the elements thus shifted to a number of bits equal to the word length of the system. The autocorrelation array thus has a number of elements equal to (p+1).

Since the autocorrelation array is symmetric, it can be described completely by storing the elements with positive indices, a total of (p+1) elements. These elements are stored in RAM 722 in a location that is controlled by normalizer 720.

The operation of the circuits of FIGS. 7, 8, 9 and 10 is explained further in the flowchart of FIG. 11 which shows the sequence of operations that are performed by those circuits. In FIG. 11, after a start 1120, an operations block 1121 windows the input samples. The technique of windowing is well known in the art and can be described by the following equation:

$$s(n)=x(n)w(n) \text{ for } 0 \geqq n \geqq N-1$$

Where N is the number of samples in a frame, x(n) are the input samples for the current frame, w(n) are the samples from a prestored window function (such as a Hamming or Hanning window which are well know in the art), and s(n) are the samples after windowing.

Operations block 1122 then directs the determination of autocorrelation coefficients. Such a determination is well known. For discrete or sampled components, it is normally accomplished by a calculation such as that of the following equation:

$$R(i) = \sum_{n=i}^{N-1} s(n)s(n-i),\ 0 \leqq i \leqq p$$

where s(n), 0≦n≦N−1 are the windowed samples of the audio signal during a frame and p is the order of the filter.

The next step in the flowchart of FIG. 11 is to initialize the arrays of F and C as indicated in operations block 1126. The quantities F and C are intermediate quantities used in the determination of LPC coefficients. Their initial values are determined as follows:

$$F_o(i)=R(i),\ 0 \leqq i \leqq p \leqq 1$$

$$Co(i)=R(|i+1|),\ 1-p \leqq i \leqq p-1$$

Operations box 1128 next directs that the value of j equal 1. Operations box 1130 then calls for the determination of the quantity kj, the jth reflection coefficient. This is determined as follows:

$$K_j = \frac{-C_{j-1}(0)}{F_{j-1}(0)}$$

After the value of $k_j$ is determined, it is quantized according to the instruction from operations block 1132 at a quantization level that is determined by the number of bits reserved to broadcast the particular LPC coefficient in question. Decision block 1134 next tests to see whether j=p. If it does, all of the LPC coefficients have been calculated, and exit is to operations block 1136 to end the calculation. If i does not equal p, the calculated value of $k_j$ is used in operations block 1138 to update values of F and C according to the following relations:

$$F_j(i)=(1+k_j^2)F_{j-1}(i)+k_j[C_{j-1}(i)+C_{j-1}(-i)]\text{-}\quad 0\leqq i\leqq p-j-1$$

$$C_j(i)=C_{j-1}(i+1)+k_j^2C_{j-1}(-1-i)+2k_jF_{j-1}(|i+1\text{-}|)(1+j-p)\leqq i\leqq(p-j-1).$$

The value of j is increased by 1 in operations block 1140, and control returns to operations block 1130 to continue the calculations.

The preceding description shows a circuit for determining LPC coefficients and a flowchart of the steps performed by that circuit. The flowchart of FIG. 11 is also useful in directing the steps of a program for determining LPC coefficients by the same method using a computer. This has been done, and a computer program for determining LPC coefficients using this method is included as an appendix to this application. The technique of the present invention has the particular advantage that calculations may be performed efficiently in integer arithmetic. This speeds calculations and makes it possible to determine LPC coefficients in real time using the present invention.

Figure 6:
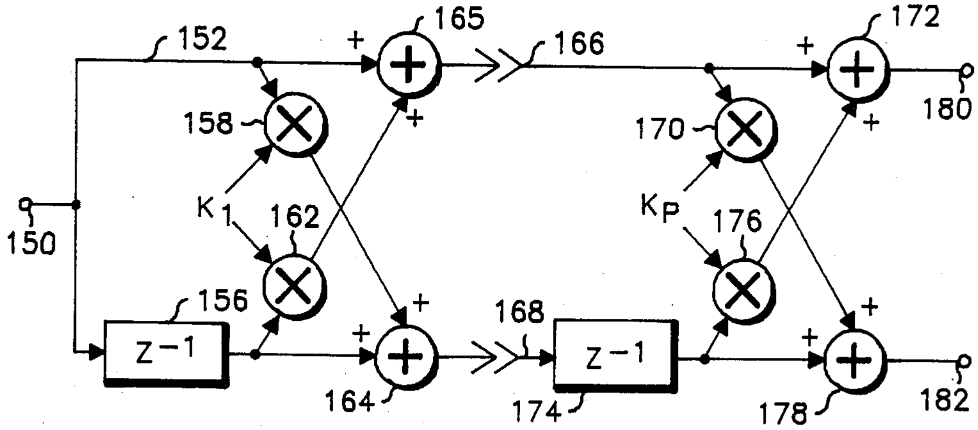
FIG. 6 is a block diagram of a section of a typical lattice filter for the practice of the present invention.

FIG. 6 is a block diagram of a lattice filter that provides a further explanation of the process by which the circuits of FIGS. 1 and 7 obtain reflection coefficients. In FIG. 6 a terminal 150 receives as an input the sampled signal. This signal is applied to an upper leg 152 which will calculate a forward residual, and it is applied to a lower leg 154 which will apply the signal to the first of a sequence of delay elements 156 to calculate a backward residual. FIG. 6 comprises a cascade of elements, each of which applies the forward signal to a multiplier 158 and a summer 165. The backward signals are applied to a multiplier 162 and a summer 164. Both multipliers 158 and 162 receive as additional inputs the current reflection coefficient. Thus, the current forward residual is multiplied by the current reflection coefficient and added to the current backward residual in summer 164 to generate as an output the next backward residual. The current backward residual is multiplied in multiplier 162 with the current reflection coefficient and added to the current forward residual in summer 160 to generate the next forward residual. The process just described continues through a number of sections of the lattice filter that is determined by the designer as a number adequate to characterize the particular signal in question. This is typically a number of stages equal to 8, 10 or 12. The last such stage is shown here as receiving a current forward residual signal on terminal 166 and a current backward residual signal on terminal 168. The current forward residual signal is applied to a multiplier 170 and a summer 172, while the current backward residual is delayed in delay element 174, and the delayed signal is applied to multiplier 176 and summer 178. Both multipliers 170 and 176 receive as additional inputs the current reflection coefficient. If the lattice filter has been designed with an adequate number of sections to approximate the input signal sufficiently well, then the output of the final forward residual signal at terminal 180 will be close to zero and so will the final backward residual signal at terminal 182.

The result of applying a signal to this circuit of FIG. 6 is the production in forward line 152 of a sequence of elements of a forward residual vector and to produce in line 156 the elements of a backward residual vector. Individual elements are combined to produce an autocorrelation of the forward residual elements, and autocorrelation of the backward residual elements, and a cross-correlation between forward and backward residual elements. These arrays are used as described earlier to calculate the reflection coefficients.

If, as described in FIGS. 7,8,9,10 and 11, the input signal is windowed, these three arrays reduce to just two arrays, an autocorrelation array of the forward residuals (which is equivalent to the autocorrelation array for the backward residuals) and a cross-correlation array between the forward and backward residuals.

Lattice methods of determining coefficients for linear predictive coding have been used in the past. However, circuits and programs used to determine the lattice coefficients have used intermediate variables that varied in magnitude over a wide range. This required a wide range of quantized values to characterize the intermediate variables, and thus required greater cost to implement. The circuit arrangements and methods of the present invention uses only intermediate variables which are bonded in magnitude by unity. This permits operations and calculations to be performed in a fixed-point fractional implementation. In addition if the input signal is windowed so that it it stationary in a statistical sense, then it can be shown that the number of computations necessary to determine lattice coefficients is reduced still further. The method and means of the present invention has been used with a frame length of approximately 15 milliseconds to determine 12 lattice coefficients in real time, by completing the calculations for the date of one frame before the end of the next succeeding frame.

I claim:

1. A method of processing a digitized electrical signal, representative of voice or similar autoregressive signal, to obtain lattice coeffieients of an inverse lattice filter that characterizes the voice signal, said method comprising the steps of:

(a) inputting said digitized waveform;

(b) selecting samples of the digital signal for a time period equal to a predetermined frame length;

(c) temporarily storing said selected digital samples;

(d) determining correlation coefficients of said selected samples;

(e) calculating and storing initial values of F,B, and C arrays, wherein said matricies indicate the correlation values of the forward residual, backward residual, and values of cross correlation for forward and backward residuals, respectively;

(f) calculating a first reflection coefficient from said stored initial values of said F, B, and C arrays wherein said calculated first reflection coefficient indicates the partial correlation between said forward and backward residuals;

(g) outputting said first reflection coefficient to an output register, from which said coefficients are available for use in modifying the characteristics of the inverse lattice filter;

(h) adjusting said stored values of F, B, and C matricies to reflect the new values of forward and backward residuals calculated from said first reflection coefficient and previous forward and backward residuals; and (i) repeating the steps of calculating, outputting and adjusting until a predetermined number of reflection coefficients has been obtained.

2. The method of claim 1 wherein said initializing step for F, B, and C matricies comprises the step of determining the initial values according to the relationship:

$$F_0(i,k)=\phi(i,k) 0\leqq i\leqq k\leqq p-1, \text{ for } F \text{ and } B$$

$$B_0(i,k)=\phi(i+1,k+1)$$

$$C_0(i,k)=\phi(i,k+1) \text{ for } 0\leqq i,k\leqq p-1$$

$$\phi(i,k)=\sum_{n=p}^{N-1} s(n-i)s(n-k),\ 0\leqq K\leqq i\leqq p$$

wherein

3. The method of claim 1 wherein said reflection coefficients are determined according to the relationship:

$$k_j=\frac{-2C_{j-i}(0,0)}{F_{j-i}(0,0)+B_{j-i}(0,0)}$$

4. The method of claim 1 wherein the step of determining correlation coefficients comprises the step of obtaining the sum of products of sampled signals according to the relationship $$\phi(i,k)=\sum_{n=p}^{N-1} s(n-i)s(n-k),\ 0\leqq i\leqq k\leqq p$$

where s(n), $0<n<N-1$ are samples of the audio signal during a frame and p is the order of the filter.

5. The method of claim 1 wherein the F array is defined according to the relation and $$F_j(i,k)=F_{j-1}(i,k)+K_j[C_{j-1}(i,k)+C_{j-1}(k,i)]+k_j^2B_{j-1}(i,k) \text{ for } 0\leqq i\leqq k\leqq(p-j-1).$$

6. The method of claim 1 wherein the B array is determined according to $$B_j(i,k)=B_{j-1}(i+1,k+1)+k_j[C_{j-1}(i+1,k+1)+C_{j-1}(k+1,i+1)]+k_j^2F_{j-1}(i+1,k+1) \text{ for } 0\leqq i\leqq k\leqq(p-j-1).$$

7. The method of claim 1 wherein the C array is determined according to, $$C_j(i,k)=C_{j-1}(i,k+1)+k_j[B_{j-1}(i,k+1)+F_{j-1}(i,k+1)]+k_j^2C_{j-1}(k+1,i) \text{ for } 0\leqq i,k\leqq(p-j-1).$$

8. An apparatus for processing an analog electrical signal to obtain reflection coefficients of an inverse lattice filter that characterize the analog electrical signal, the apparatus comprising:

(a) a filter receiving the analog electrical signal and producing a filtered analog electrical signal;

(b) an analog-to-digital converter connected to the filter to produce a digital signal;

(c) A framer to select time intervals of a predetermined amount;

(d) a correlator connected to the framer and to the analog-to-digital converter to produce correlation coefficients of the digitals signals during each framed interval;

(e) a normalizer connected to the correlator to normalize the correlation coefficients of the correlator;

(f) a first RAM connected to the normalizer to receive and store normalized correlation coefficients;

(g) a sequencer that generates a plurality of control signals;

(h) an address calculator connected to the sequencer and to the first RAM to control addresses at which normalized correlation coefficients are stored in the first RAM;

(i) a multiplexer connected to the first RAM and receiving data as input from the first RAM;

(j) a second RAM connected to the multiplexer and to the address calculator, the second RAM receiving input from the multiplexer and storing that input in a location controlled by the address calculator;

(k) a reflection coefficient calculator connected to the second RAM and to the sequencer, the reflection coefficient calculator receiving data from the second RAM and calculating reflection coefficients under control from the sequencer; and (l) an update circuit connected to the reflection coefficient calculator, the second RAM, and the sequencer to calculate current coefficients under the control of the sequencer and produce an output which is taken as an input by the multiplexer.

9. A method of processing a digitized electrical signal, representative of voice or similar autoregressive signal, to obtain lattice coefficients of an inverse lattice filter that characterize the voice signal, said method comprising the steps of:

(a) inputting said digitized waveform;

(b) selecting samples of the digital signal for a time period equal to a predetermined frame length;

(c) temporarily storing said selected digital samples;

(d) multiplying said selected, stored samples by a predetermined window function;

(e) determining autocorrelation coefficients of said selected samples;

(f) calculating and storing initial values of F, and C arrays, wherein said arrays indicate the autocorrelation values of the forward and backward residuals, and values of cross correlation for forward and backward residuals, respectively;

(g) calculating a first reflection coefficient from said stored initial values of F, and C arrays wherein said calculated first reflection coefficient indicates the partial correlation between said forward and backward residuals;

(h) outputting said first reflection coefficient to an output register, from which said coefficients are available for use in modifying the characteristics of the inverse lattice filter;

(i) adjusting said stored values of F, and C arrays to reflect the new values of forward and backward residuals calculated from said first reflection coefficient and previous forward and backward residuals; and (j) repeating the steps of calculating, outputting and adjusting until a predetermined number of reflection coefficients has been obtained.

10. The method of claim 9 wherein said initializing step for said F, and C arrays comprises the step of determining the initial values according to the relationship:

$$F_0(i)=R(i) \text{ for } 0\leqq i\leqq p-1$$

$$C_0(i)=R(|i+1|) \text{ for } 1-p\leqq i\leqq p-1$$

wherein $$R(i) = \sum_{n=i}^{N-1} s(n)s(n-i),\ 0 \leqq i \leqq p$$

where s(n) are prestored windowed samples.

11. The method of claim 10 wherein the R array is normalized to the range between ¼ and ½ full scale by multiplying both arrays by a scalar value prior to loading F and C arrays.

12. The method of claim 9 wherein said reflection coefficients are determined according to the relationship:

$$k_j = \frac{-C_{j-1}(0)}{F_{j-1}(0)}$$

13. The method of claim 12 wherein reflection coefficients are quantized to less precision than calculated.

14. The method of claim 13 wherein the window function is a Hamming window which is defined as follows:

$$w(n) = 0.54 - 0.46 \cos(2\pi n/(N-1)) \text{ for } 0 \leqq n \leqq N-1$$

15. The method of claim 9 wherein windowing of selected stored samples is performed according to the following relationship:

$$s(n) = x(n)w(n) \text{ for } 0 \leqq n \leqq N-1$$

where x(n) are the selected stored samples, w(n) are the samples of an appropriate window function and s(n) are the samples after windowing and N is the number of samples in the frame.

16. The method of claim 9 wherein the steps of determining correlation coefficients comprises the step of obtaining the sum of products of windowed sampled signals according to the relationship:

$$R(i) = \sum_{n=i}^{N-1} s(n)s(n-i),\ 0 \leqq i \leqq p$$

where s(n), $0<n<N-1$ are samples of the audio signal during a frame and p is the order of the filter.

17. The method of claim 9 wherein the F array is defined according to the relation:

$$F_j(i) = (1+K^2)F_{j-1}(i) + k_j[C_{j-1}(i) + C_{j-1}(-i)] \text{ for } 0 \leqq i,k \leqq (p-j-1).$$

18. The method of claim 9 wherein the C array is determined according to the relation:

$$C_j(i) = C_{j-1}(i+1) + k_j^2 C_{j-1}(-i-1) + 2k_jF_{j-1} \text{ for } (1+j-p) \leqq i \leqq (p-j-1).$$

19. The method of claim 9 wherein said F and C arrays are normalized to the range between ¼ and ½ full scale by multiplying both arrays by the same scalar value during the updating process.

20. An apparatus for processing an analog electrical signal to obtain reflection coefficients of an inverse lattice filter that characterizes the analog electrical signal, the apparatus comprising:

(a) a filter receiving the analog electrical signal and producing a filtered analog electrical signal;

(b) an analog-to-digital converter connected to the filter to produce a digital signal;

(c) a windower to select samples over time intervals of a predetermined amount, and multiply them by a window function;

(d) a correlator connected to the windower to produce autocorrelation coefficients of the windowed digital signals during each framed interval;

(e) a normalizer connected to the autocorrelator to normalize the correlation coefficients of the correlator;

(f) a first RAM connected to the normalizer to receive and store normalized autocorrelation coefficients;

(g) a sequencer that generates a plurality of control signals;

(h) an address calculator connected to the sequencer and to the first RAM to control addresses at which normalized correlation coefficients are stored in the first RAM;

(i) a multiplexer connected to the first RAM and receiving data as input from the first RAM;

(j) a second RAM conneced to the multiplexer and to the address calculator, the second RAM receiving input from the multiplexer and storing that input in a location controlled by the address calculator;

(k) a reflection coefficient calculator connected to the second RAM and to the sequencer, the reflection coefficient calculator receiving data from the second RAM and calculating reflection coefficients under control from the sequencer; and (l) an update circuit connected to the reflection coefficient calculator, the second RAM, and the sequencer to calculate current coefficients under the control of the sequencer and produce an output which is taken as an input by the multiplexer.

* * * * *

UNITED STATES PATENT AND TRADEMARK OFFICE
CERTIFICATE OF CORRECTION

PATENT NO. : 4,544,919

DATED : Oct. 1, 1985

INVENTOR(S) : Ira Gerson

It is certified that error appears in the above-identified patent and that said Letters Patent is hereby corrected as shown below:

IN THE ABSTRACT:

In the Abstract, on line 5, change "sample" to --sampling--;

In the Abstract, on line 7, after "arrays" insert --of--.

IN THE DRAWINGS:

In the drawings, the first 4 sheets of drawings indicate "n/4" and should indicate --n/8-- sheets;

Please also reinstate sheets 5 through 8 of the drawings, which include Figures 7 - 11 referred to in column 3 of the specification. New drawings are enclosed.

IN THE SPECIFICATION:

In Column 1, line 11, change "1982" to --1983--;
line 61, change "with" to --of--.

In Column 4, line 11, after "condition" delete "of" and insert --to--;
line 28, change "matrix" to --array--;
line 37, change "42" to --52--;
line 38, delete "than" and insert --then--;
line 43, after "added" insert --to--.

In Column 5, line 55, after "covariance" insert --array--;
line 55, change "matrix" to --array--.

UNITED STATES PATENT AND TRADEMARK OFFICE
CERTIFICATE OF CORRECTION

PATENT NO. : 4,544,919

DATED : Oct. 1, 1985

INVENTOR(S) : Ira Gerson

It is certified that error appears in the above-identified patent and that said Letters Patent is hereby corrected as shown below:

In Column 6, line 6, after "covariance" insert --array--;
line 40, between "(i,k)" and "0" insert --,--;
line 44, between "(i,k+1)" and "0" insert --,--;
line 47, change "kj" to be --$k_j$--;
lines 50-53, change "$kK_j$=" to -- $k_j$= --.

In Column 7, line 2, between "$C_{j-1}(k,i)]$" and "$k_j 2$" insert -- + --;
line 2, change "p=j=1" to --(p-j-1)--;
line 2, between "(i,k)" and "$0 \leq i \leq k \leq p-j-1$" insert --,--;
line 2, after "F" delete "+0";
line 5, after "$F_{j-1}(i+1,k+1)$" insert --$0 \leq i \leq k \leq (p-j-1)$ for B--;
lines 5 and 6, move "$F_{j-1}(i+1,k+1)$" to be at the end of the previous line.

In Column 8, line 33, change "842" to --852--;
line 39, after "added" insert --to--.

In Column 9, line 17, after "applied" insert --to--;
line 54, change "$0 \geq n \geq N-1$" to --$0 \leq n \leq N-1$--.

In Column 10, line 6, change "20" to --720--;
line 23, change "$0 \geq n \geq N-1$" to --$0 \leq n \leq N-1$--;
line 49, change "$p \leq 1$" to --p-1--.

UNITED STATES PATENT AND TRADEMARK OFFICE

CERTIFICATE OF CORRECTION

PATENT NO. : 4,544,919

DATED : Oct. 1, 1985

INVENTOR(S) : Ira Gerson

It is certified that error appears in the above-identified patent and that said Letters Patent is hereby corrected as shown below:

In Column 11, line 3, after "$C_{j-1}(-i)]$" insert --,--; line 7, delete "])" and insert these characters at the end of the previous line, line 6;

line 45, change "160" to --165--.

In Column 12, line 22, correct "bonded" to be --bounded--; line 32, change "date" to --data--; line 37, correct "coeffieients" to be --coefficients--; line 47, delete "matricies" and insert --arrays--; lines 61-62, delete "matricies" and insert --arrays--.

In Column 13, line 2, delete "matricies" and insert --arrays--; line 5, between "(i,k)" and "$0\leq i\leq k\leq p-1$" insert --,--; line 13, change "$0\leq K\leq i\leq p$" to --$0\leq i\leq k\leq p$--; line 15, move "wherein" to be in line 11; line 37, change "$K_j$" to --$k_j$--;

line 37, after "$C_{j-1}$" move "(-" to line 38;

line 42, delete "$C_{j-}$" and insert in line 43, so that it reads: "$C_{j-1}$";

line 48, move "$F_{j-}$" into line 49, so that it reads: "$F_{j-1}$".

UNITED STATES PATENT AND TRADEMARK OFFICE
CERTIFICATE OF CORRECTION

PATENT NO. : 4,544,919

DATED : Oct. 1, 1985

INVENTOR(S) : Ira Gerson

It is certified that error appears in the above-identified patent and that said Letters Patent is hereby corrected as shown below:

In Column 15, line 21, change "14." to --15.--;
line 21, change "13" to --14--;
line 27, change "15." to --14.--;
(then reverse the positions of claims newly labelled 15. and 14. so that they are in order.)
line 51, change "$K^2$" to --$k_j^2$--;
line 52, after "i" delete ",k".

In Column 16, line 4, before "for" change "$2kjF_{j-1}$" to --$2k_jF_{j-1}(|i+1|)$--.

Signed and Sealed this

Twenty-third Day of December, 1986

*Attest:*

DONALD J. QUIGG

*Attesting Officer* *Commissioner of Patents and Trademarks*